United States Patent [19]

Tsuchihashi et al.

[11] 4,174,876
[45] Nov. 20, 1979

[54] MOUNTING MECHANISM FOR ENCLOSURE

[75] Inventors: Yasutaka Tsuchihashi, Tokyo; Tatsuhiko Omoto, Hachioji, both of Japan

[73] Assignee: Olympus Optical Co., Ltd., Tokyo, Japan

[21] Appl. No.: 912,085

[22] Filed: Jun. 2, 1978

[30] Foreign Application Priority Data

Jun. 14, 1977 [JP] Japan .............................. 52-76760[U]

[51] Int. Cl.$^2$ ............................................ H01R 3/04
[52] U.S. Cl. .................................................... 339/96
[58] Field of Search ....................... 339/95 R, 95 A, 96, 339/14; 174/51

[56] References Cited

U.S. PATENT DOCUMENTS

| 1,928,157 | 9/1933 | Levin | 339/95 A |
| 2,862,040 | 11/1958 | Curran | 174/51 |
| 3,588,787 | 6/1971 | Kendell et al. | 339/95 A |

FOREIGN PATENT DOCUMENTS 1342594  1/1974  United Kingdom ...................... 174/51

Primary Examiner—Joseph H. McGlynn
Attorney, Agent, or Firm—Lerner, David, Littenberg & Samuel

[57] ABSTRACT

A mounting mechanism for an enclosure of an electrical unit comprises a conductive baseplate on which parts are to be mounted, an electrically conductive enclosure having an insulating coating which is adapted to be mounted on the baseplate by means of conductive screw, and a dowel located on the enclosure for abutment against the rear side of the head of the conductive screw. As the screw is threadably engaged with the enclosure, the dowel operates to remove the insulating coating located thereon to provide an electrical connection between the baseplate and the enclosure.

6 Claims, 4 Drawing Figures

MOUNTING MECHANISM FOR ENCLOSURE

BACKGROUND OF THE INVENTION

The invention relates to a mounting mechanism for enclosure of an electrical unit, and more particularly to such mechanism which provides an electrical connection between a conductive enclosure having an insulating coating and a conductive, parts-carrying baseplate as a conductive screw is used to mount the enclosure on the baseplate.

In electrical units such as tape recorders of a reduced size, in particular, of a miniature size, circuit components and drive parts are mounted on a conductive baseplate, which is then received in an enclosure such as the recorder casing. To avoid electrical contact between the components and the enclosure, the latter is either formed of an insulating material or formed of a conductive material with an insulating coating layer over the entire surface thereof. In order to provide the shielding effect which prevents adverse influences upon the internal electrical circuit of external electric or magnetic fields, the enclosure is electrically connected with the baseplate.

Referring to FIGS. 1 and 2 which show prior art arrangements to make such electrical connections there is shown a conductive baseplate 1 on which parts are to be mounted. a conductive post 2 is fixedly mounted on the baseplate with its upper end formed with a threaded bore 3, into which a conductive headed screw 6 is fitted, with an enclosure 4 having an insulating coating 5 disposed between the head of the screw and the post and the screw extending through an opening 4a formed in the enclosure. In this manner, the conductive enclosure 4 is secured to the baseplate 1. To provide an electrical connection between the enclosure and the baseplate, the coating 5 is previously removed in a region a of the enclosure 4 which is adapted to engage the post 2. Alternatively, the insulating coating is previously removed in a region b of the enclosure 4 which is adapted to engage the bottom surface of the head 6a of the screw 6, which joins the threaded body 6 as shown in FIG. 2.

However, with the techniques illustrated in FIGS. 1 and 2, the insulating coating 5 must be previously removed from the enclosure 4 before the screw is set in place. The removal represents a troublesome operation, and there is also a likelihood that the enclosure may be mounted in place without previously removing part of its insulating coating. If one fails to remove the coating, it is very difficult to notice such failure of removal without disassembling the connection. In addition, a region of the enclosure from which the insulating coating is removed may be exposed externally to the elements which may degrade the appearance or may give rise to the occurrence of rust.

SUMMARY OF THE INVENTION

It is an object of the invention to provide a mounting mechanism for a conductive enclosure having an insulating coating which is to be secured to a conductive, parts-carrying baseplate by means of a conductive screw wherein a dowel is provided on a region of the enclosure which is adapted to engage the bottom surface of the head of the screw, thereby avoiding the difficulties of the prior art.

In accordance with the invention, the engagement between the dowel and the conductive screw automatically removes part of the insulating coating from the enclosure, thus avoiding the need for a previous removal thereof and also avoiding any damage to the appearance while preventing the likelihood of causing corrosion or rust or inadvertently mounting the enclosure without previously removing the insulating coating.

DESCRIPTION OF EMBODIMENT

Figure 1:
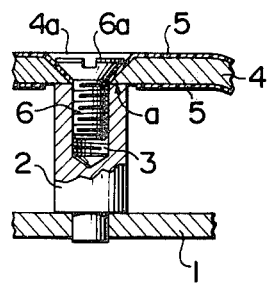
FIGS. 1 and 2 are schematic cross-sections of prior arrangements for mounting an enclosure on a conductive baseplate.
Figure 2:
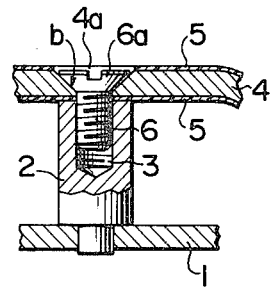
Figure 3:
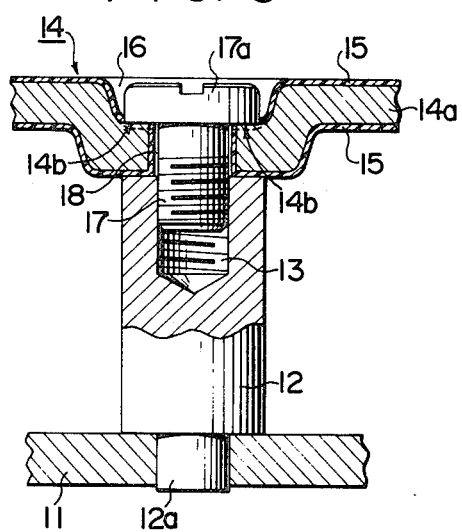
FIG. 3 is a similar cross-section of the mounting mechanism according to one embodiment of the invention.
Figure 4:
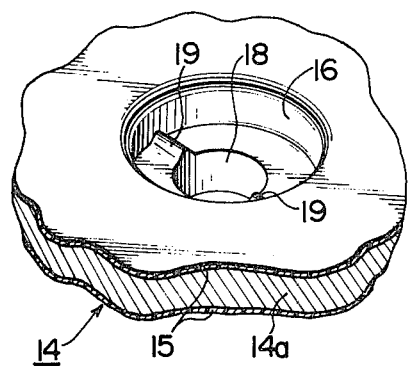
FIG. 4 is an enlarged, fragmentary perspective view of the enclosure shown in FIG. 3.

Referring to FIG. 3, there is shown a conductive baseplate 11 on which parts are to be mounted. The baseplate 11 is adapted to be received in an enclosure 14 such as the casing of a tape recorder or like electrical unit. A conductive post 12 has its lower end 12a fixedly mounted on the baseplate 11 as by threadable engagement or by a press fit. The upper end of the post 12 is formed with a threaded bore 13 for receiving a conductive headed screw 17. The enclosure 14 may comprise a conductive sheet material 14a such as almite, for example, having an insulating coating 15 on both its upper and lower surfaces. A recess 16 is formed in the enclosure at a position where it is to be secured to the post, the recess being of a depth which prevents the head 17a of the screw 17 from projecting above the level of the outer surface of the enclosure. An opening 18 is formed centrally in the bottom of the recess 16 to allow the screw 17 to pass therethrough, as shown in FIG. 4. It will be noted that a pair of raised dowels 19 are formed on the bottom surface of the recess 16 and are arranged diametrically opposite one another about opening 18. These dowels are located in a region 14b of the enclosure 14 which is adapted to engage the bottom surface of the head 17a. It is to be understood that the coating 15 extends throughout the surface of the enclosure including the recess 16 and the dowels 19. However, it will be seen from FIG. 3 that when the post 12 is aligned with recess of the enclosure 14 so that the screw 17 can extend through the opening 18 and into the threaded bore 13, the bottom surface of the head 17a slides past the dowels 19 as the screw 17 is tightened, thus removing the insulating coating from the surface of these dowels to bring the bottom surface of the head 17a into direct contact with the sheet material 14a. In this manner, when the headed screw 17 is used, the enclosure 14 and the baseplate 11 are both mechanically and electrically connected together through the screw 17 and the post 12. Fragments of the coating 15 removed from the surface of the dowels 19 will accumulate on the bottom surface of the recess in a region adjacent to these dowels, but they cannot impede the mechanical and electrical connection between the screw 17 and the enclosure 14. Since the coating 15 is removed as a result of the sliding contact of the head 17a with the dowels 19, the possibility that an excessive removal of the coating to present an exposed sheet material 14a to degrade the appearance or to give rise to the occurrence of rust is avoided.

A variety of modifications and changes in the embodiment described above will readily occur to those skilled in the art. By way of example, instead of dowels 19 in the form of the raised portions extending diametrically of the opening 18, a small projection in the form of a spot may be provided. Also, the number of such projections may be changed as desired. While the provision of the recess 16 in the enclosure 14 prevents a degraded appearance if head 17a is not maintained in contact with the surface of the enclosure 14, such recess may be dispensed with if the height of such projection or projections is limited since then there can be no clearance between the head 17a and the enclosure 14 through which they can be viewed. In addition, the post 12 may be dispensed with, screwing the enclosure 14 directly onto the baseplate.

What is claimed is:

1. A mounting assembly for an enclosure comprising a conductive baseplate on which parts are to be mounted, a conductive enclosure having an insulating coating and adapted to be mounted on the baseplate, a conductive screw for securing the enclosure to the baseplate, said screw having a threaded body integrally joined to a head adapted to facilitate twisting of said threaded body into said baseplate, and a small projection on the surface of the enclosure and located in a region thereof which is adapted to engage the bottom surface of the head of the screw joining said threaded body, the projection cooperating with the screw to remove insulating coating only from said projection as the latter is engaged by the bottom surface of the screw head when the screw is being tightened, thus providing an electrical connection between the enclosure and the baseplate.

2. A mounting assembly according to claim 1 in which the enclosure is formed with a recess in said region which is of a depth which is sufficient to prevent the head of the conductive screw from projecting above the surface of the enclosure, an opening being formed in said region of the enclosure to permit the screw to pass therethrough, said projection being formed around the opening.

3. A mounting assembly according to claim 1 in which the projection is in the form of raised portions extending on diametrically opposite sides of the opening.

4. A mounting assembly according to claim 1 in which more than one projection is provided.

5. A mounting assembly for an enclosure comprising a conductive baseplate upon which components are to be mounted;

a conductive enclosure member having an insulating coating and adapted to be mounted upon said baseplate;

a conductive screw for securing the enclosure to the baseplate;

said enclosure having an opening for receiving said conductive screw which is adapted to threadedly engage said baseplate;

a projection having an insulating coating thereon and responsive to tightly screwing of said screw into said baseplate for removing only the insulating coating on said projection as said screw is tightly fastened to said baseplate to provide an electrical connection between said enclosure and said baeplate, as well as the mechanical connection therebetween.

6. The mounting assembly of claim 5 wherein said projection is on the surface of said enclosure and is adapted to be engaged by said screw head upon removal of said insulation covering on the projection when the screw is tightly fastened to the baseplate.

* * * * *